(12) United States Patent
Georgescu et al.

(10) Patent No.: US 7,149,123 B2
(45) Date of Patent: Dec. 12, 2006

(54) NON-VOLATILE CMOS REFERENCE CIRCUIT

(75) Inventors: Sorin S. Georgescu, San Jose, CA (US); Ilie Marian I. Poenaru, Bucharest (RO)

(73) Assignee: Catalyst Semiconductor, Inc., Santa Clara, CA (US)

( * ) Notice: Subject to any disclaimer, the term of this patent is extended or adjusted under 35 U.S.C. 154(b) by 85 days.

(21) Appl. No.: 11/100,347

(22) Filed: Apr. 5, 2005

(65) Prior Publication Data

US 2005/0219916 A1 Oct. 6, 2005

Related U.S. Application Data

(60) Provisional application No. 60/560,140, filed on Apr. 6, 2004.

(51) Int. Cl.
*G11C 11/34* (2006.01)
(52) U.S. Cl. ............... 365/185.24; 365/185.03; 365/185.19; 365/189.01
(58) Field of Classification Search ........... 365/185.24, 365/189.01, 185.03, 185.19
See application file for complete search history.

(56) References Cited

U.S. PATENT DOCUMENTS

| | | | | |
|---|---|---|---|---|
| 4,604,732 A | * | 8/1986 | van Tran | 365/207 |
| 5,309,009 A | | 5/1994 | Chao | 257/318 |
| 5,495,453 A | | 2/1996 | Wociechowski et al. | |
| 5,740,106 A | | 4/1998 | Nazarian | |
| 5,901,085 A | | 5/1999 | Kramer et al. | |
| 5,963,084 A | | 10/1999 | Eschauzier | 327/553 |
| 6,028,335 A | | 2/2000 | Okamoto et al. | |
| 6,133,780 A | | 10/2000 | Chi | 327/541 |
| 6,297,689 B1 | | 10/2001 | Merrill | |
| 6,411,549 B1 | | 6/2002 | Pathak et al. | |
| 6,414,536 B1 | | 7/2002 | Chao | |
| 6,532,170 B1 | | 3/2003 | Madurawe et al. | |
| 6,882,582 B1 | * | 4/2005 | Sicard et al. | 365/189.09 |

OTHER PUBLICATIONS

Harrison et al.: "A CMOS :Programmable Analog Memory-Cell Array Using Floating Gate Circuits"; IEEE 2001; IEEE Transactions On Circuits And Systems-II: Analog And Digital Signal Processing, vol. 48, No. 1, Jan. 2001. pp. 4-11.

* cited by examiner

*Primary Examiner*—Anh Phung
*Assistant Examiner*—N Nguyen
(74) *Attorney, Agent, or Firm*—Bever, Hoffman & Harms, LLP; E Eric Hoffman

(57) ABSTRACT

A voltage reference circuit provides a reference voltage that can be precisely programmed. The threshold voltage of a first non-volatile memory (NVM) transistor is programmed while coupled in parallel with a reference NVM transistor, wherein a first voltage is applied to the control gate of the first NVM transistor, and a reference voltage is applied to the control gate of the reference NVM transistor. The threshold voltage of a second NVM transistor is programmed while coupled in parallel with the reference NVM transistor, wherein a second voltage is applied to the control gate of the second NVM transistor, and the reference voltage is applied to the control gate of the reference NVM transistor. The first and second NVM transistors are then coupled in parallel, and a differential amplifier is used to generate a single-ended reference voltage in response to the programmed threshold voltages of the first and second NVM transistors.

20 Claims, 10 Drawing Sheets

NON-VOLATILE CMOS REFERENCE CIRCUIT

BACKGROUND OF THE INVENTION

1. Technical Field

The present invention is in the field of non-volatile programmable integrated circuits.

2. Description of Related Art

Voltage references are built in two main types: (1) band-gap based reference circuits; volatile and (2) non-volatile memory cell-based reference circuits.

The vast majority of voltage references used today essentially replicate the silicon band-gap voltage and involve significant amount of circuitry to allow for proper functionality. A typical band-gap circuit includes a number of bipolar transistors (NPN or PNP) and an associated set of resistors. The forward voltage of a P-N diode has a large temperature coefficient, which is canceled by adding a series resistive voltage drop having opposite temperature coefficient. There are significant drawbacks with this classical approach, including: (1) the reference tuning is difficult and requires lengthy silicon iterations, (2) the operation at low currents requires very large resistors, and (3) the overall circuit is rather complicated and expensive in terms of silicon area. Moreover, the classical band-gap circuits have difficulty achieving a very low temperature coefficient due to inherent second order temperature effects. Trimming the reference to values other than the silicon band-gap requires additional circuits and involves a significant increase in area consumption.

Voltage references based on non-volatile memory cells are a more recent approach in integrated circuits. In general, a floating node of a non-volatile memory cell is programmed to a desired voltage level. The programmed voltage level is then copied to a low impedance node using standard analog circuit methods. It is noted that any floating node capacitor can keep a certain amount of charge (and voltage) indefinitely, due to extremely low leakage of silicon oxides. For the same reason, such floating nodes cannot be used as direct reference voltages, since they cannot drive any current. An amplifier is needed to buffer the floating node onto a low impedance reference node, which can be used for external purposes. In this regard, the reader is directed to the following references, which are incorporated herein by reference in their respective entireties: U.S. Pat. No. 6,297,689 (Merrill); and U.S. Pat. No. 6,414,536 (Chao).

The use of a single floating node of a non-volatile memory cell to generate a voltage reference has a number of drawbacks, including: (1) the circuit required to program the single floating node introduces a capacitive coupling, which produces an offset between the programmed voltage and the read voltage, (2) charge de-trapping occurring after the programming step introduces another uncertainty in the final programmed reference voltage, (3) programming stress can unpredictably change the characteristics of the non-volatile memory cell, such that resistor trimming is necessary, and (4) to obtain the lowest temperature coefficient, measurements at different ambient temperatures are required. All these impose serious restrictions in the manufacturing process for voltage references using a single floating node of a non-volatile memory cell.

A more advanced type of non-volatile reference uses two floating gate transistors in a differential mode. The floating gates of the transistors are programmed through hot electron injection using Flash-type transistors. In the read mode, a feedback amplifier produces a differential reference voltage between two nodes, wherein the differential reference voltage is the result of different thresholds of the floating gate transistors and of a bias current injected into one of the two nodes. There are number of drawbacks associated with this type of non-volatile reference. The use of hot electrons injection for charge injection makes the precise programming very difficult, because hot electron injection is very fast and non-linear with time. As a result, the precise programming of a reference voltage is a difficult task. In addition, the reference voltage is programmed in an open loop, thus requiring many iterations to obtain the target reference voltage. Such concerns are amplified in a production environment, where a precise target reference voltage has to be programmed in a simple test flow. Further complications arise from the fact that the differential reference voltage is obtained as voltage floating above the ground, so additional analog processing is needed to transfer the differential reference voltage to a single ended reference voltage. The additional circuitry not only adds to the cost of the solution but also introduces distortions that diminish the accuracy of the reference voltage.

It would therefore be desirable to have a voltage reference circuit that overcomes the above-described deficiencies of the prior art.

SUMMARY

Accordingly, the present invention provides a voltage reference circuit that includes a first non-volatile memory (NVM) transistor, a second NVM transistor and a reference NVM transistor. The reference NVM transistor is initially set to a neutral state. For example, the reference NVM transistor may be exposed to ultra-violet radiation. The first and second NVM transistors are then erased.

The voltage reference circuit is then configured to program the first NVM transistor, by coupling the first NVM transistor in a current mirror configuration with the reference NVM transistor (and disconnecting the second NVM transistor). A first reference voltage, such as ground, is applied to the control gate of the first NVM transistor, while a base reference voltage ($V_{REF}$) is applied to the gate of the reference NVM transistor. A programming voltage is applied to a programming terminal of the first NVM transistor, thereby programming the first NVM transistor through Fowler-Nordheim tunneling. Programming of the first NVM transistor is automatically stopped when the current through the first NVM transistor is at least as great at the current through the reference NVM transistor. As a result, the programmed threshold voltage of the first NVM transistor is referenced to the first reference voltage on the control gate of the first NVM transistor and the base reference voltage on the control gate of the reference NVM transistor.

The voltage reference circuit is then configured to program the second NVM transistor, by coupling the second NVM transistor in a current mirror configuration with the reference NVM transistor (and disconnecting the first NVM transistor). A second reference voltage, such as $V_{REF}$, is applied to the control gate of the second NVM transistor, while the base reference voltage ($V_{REF}$) is applied to the gate of the reference NVM transistor. A programming voltage is applied to a programming terminal of the first NVM transistor, thereby programming the second NVM transistor through Fowler-Nordheim tunneling. Programming of the second NVM transistor is automatically stopped when the current through the second NVM transistor is at least as great at the current through the reference NVM transistor. As a result, the programmed threshold voltage of the second NVM transistor is referenced to a second reference voltage on the control gate of the first NVM transistor and the base reference voltage on the control gate of the reference NVM transistor.

The voltage reference circuit is then configured to perform a read operation, by coupling the first NVM transistor in a current mirror configuration with the second NVM transistor (and disconnecting the reference NVM transistor). During the read operation, the control gate of the first NVM transistor is coupled to receive the first reference voltage, and the drains of the first and second NVM transistors are coupled to input terminals of a differential amplifier. The output terminal of the differential amplifier is coupled to the control gate of the second NVM transistor. Under these conditions, the differential amplifier provides a single-ended output voltage that is precisely equal to the difference between the programmed threshold voltages of the first and second NVM transistors. That is, the output voltage is equal to the difference between the first and second reference voltages used during the programming steps.

In one embodiment, the voltage reference circuit is configured to implement the erase, program and read operations by controlling the states of a plurality of CMOS switches.

In accordance with one embodiment, the first, second and reference NVM transistors are matched. In addition, the MOS transistors used to couple these NVM transistors in the various current mirror configurations are matched. Using matched MOS devices cancels the first order variations of the programmed reference voltage as compared to the desired value. By using the reference NVM transistor and associated MOS devices as a reference in the differential programming circuits, even second order voltage shifts are canceled, thus realizing a very precise and stable reference voltage. In one embodiment, the programming operations are automatically stopped with the floating gate voltages at the desired values by implementing a quasi-read function during the programming steps. Because the programming does not affect the mirror matching, the programmed reference has very good precision and very low intrinsic temperature coefficient. No subsequent measurements and trimming are needed for the voltage reference according to the proposed invention.

The present invention will be more fully understood in view of the following description and drawings.

DETAILED DESCRIPTION

Figure 1:
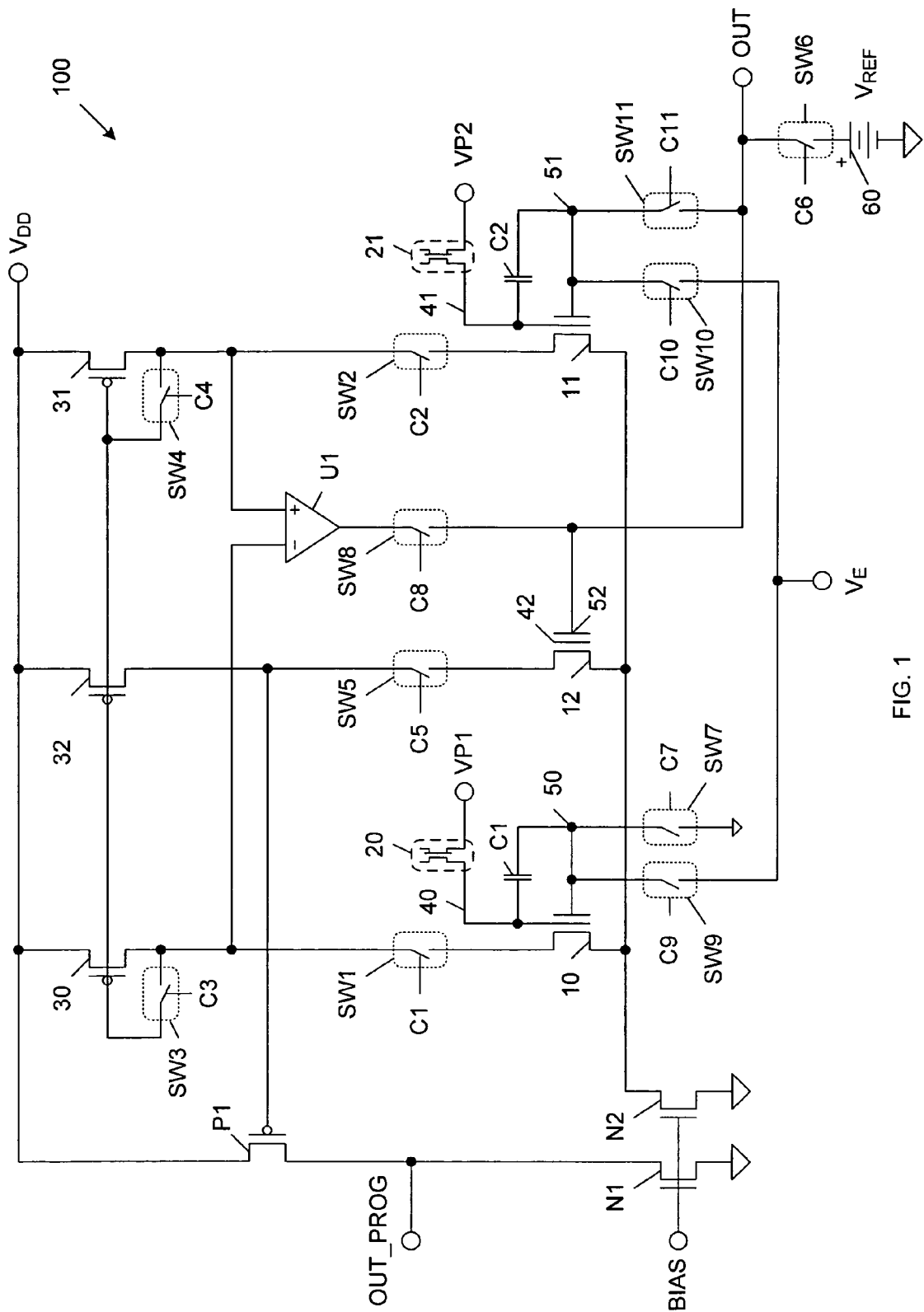
FIG. 1 is a circuit diagram of a CMOS voltage reference circuit in accordance with one embodiment of the present invention.

FIG. 1 is a circuit diagram of a CMOS voltage reference circuit 100 in accordance with one embodiment of the present invention. Voltage reference circuit 100 includes non-volatile memory (NVM) transistors 10–12, thin-dielectric tunnel capacitors 20–21, p-channel MOS transistors 30–32 and P1, n-channel MOS transistors N1–N2, capacitors C1–C2, differential amplifier U1, switches SW1–SW11 and reference voltage supply 60.

As described in more detail below, non-volatile memory transistors 10 and 11 are used during erase, programming and read operations, while non-volatile memory transistor 12 is used only during programming operations.

Non-volatile memory transistors 10–12 include floating gates 40–42, respectively, and control gates 50–52, respectively. Each of non-volatile memory transistors 10–12 has a standard double polysilicon gate structure with a dielectric thickness large enough (e.g., greater than 150 Angstroms) to prevent charge leakage from the floating gates 40–42. In one embodiment, each of the floating gates 40–42 is separated from the corresponding control gate 50–52 by a dielectric with effective silicon dioxide thickness of about 150–250 Angstroms. This dielectric can be, for example, a sandwich of silicon oxide/silicon nitride/silicon oxide (ONO). The control gate 50–52 of each memory transistor 10–12 is capacitively coupled to the respective floating gate 40–42 through this dielectric. In the described embodiment, non-volatile memory transistors 10–12 are identical.

Capacitor C1 is coupled between floating gate 40 and control gate 50 of non-volatile memory transistor 10. Similarly, capacitor C2 is coupled between floating gate 41 and control gate 51 of non-volatile memory transistor 11. Capacitors C1 and C2 increase the precision of the voltages programmed on floating gates 40 and 41, respectively, by increasing the capacitive coupling from the control gates 50–51 of these transistors to the floating gates 40–41 of these transistors. Capacitors C1 and C2 also help to lower the required programming voltage, and increase the lifetime of the programmed reference voltage by allowing some small discharge of the floating gates 40–41, especially at high temperatures.

Tunnel capacitor 20 is coupled between floating gate 40 and a first programming voltage terminal VP1. Similarly, tunnel capacitor 21 is coupled between floating gate 41 and a second programming voltage terminal VP2. In the described embodiment, each tunnel capacitor 20–21 has a thin dielectric (about 60–120 Angstroms of effective silicon dioxide) that can conduct current under a high voltage bias, in the range of about 6 to 12 Volts. As described in more detail below, tunneling current is passed through the thin dielectric of tunnel capacitors 20 and 21 to floating gates 40 and 41, respectively, thus changing the threshold voltages of non-volatile memory transistors 10 and 11 to desired levels. More specifically, tunnel capacitors 20–21 allow the electrical charging of respective floating gates 40–41 through Fowler-Nordheim oxide conduction, by applying a large voltage (of either polarity) across the thin oxide of tunnel capacitors 20–21. This physical process is well known to those knowledgeable in the field of EEPROM memory devices.

The sources of non-volatile memory transistors 10–12 are commonly connected to the drain of n-channel transistor N2. The source of n-channel transistor N2 is coupled to ground, and the gate of n-channel transistor N2 is coupled to receive a bias control signal, BIAS. The drains of non-volatile memory transistors 10, 11 and 12 are coupled to switches SW1, SW2 and SW5, respectively. Switches SW1, SW2 and SW5 are also coupled to drains of p-channel transistors 30, 31 and 32, respectively. The sources of p-channel transistors 30–32 are commonly connected to the $V_{DD}$ voltage supply terminal. The gates of p-channel transistors 30–32 are commonly connected. Switch SW3 is connected between the gate and drain of p-channel transistor 30. Switch SW4 is connected between the gate and drain of p-channel transistor 31. P-channel transistors 30–32 are therefore arranged in a current mirror configuration. In the described embodiment, p-channel transistors 30–32 are identical transistors. As a result, p-channel transistors 30–32 and non-volatile memory transistors 10–12 form three matched circuit branches.

P-channel transistor P1 has a source coupled to the $V_{DD}$ voltage supply terminal, a gate coupled to the drain of p-channel transistor 32, and a drain coupled to the drain of n-channel transistor N1. N-channel transistor N1 has a gate coupled to receive the BIAS signal and a source coupled to ground. A program control voltage OUT_PROG is provided at the drain of p-channel transistor P1 (which is also the drain of n-channel transistor N1). As described in more detail below, the OUT_ROG signal transitions to indicate that a desired voltage has been programmed on floating gate 40 or 41.

The input terminals of differential amplifier U1 are coupled to the drains of p-channel transistors 30 and 31. The output terminal of differential amplifier U1 is coupled to switch SW8. Switch SW8 is also coupled to the control gate 52 of non-volatile memory transistor 12, switches SW1 and SW6, and the reference voltage output terminal OUT.

Switch SW6 is coupled between the reference voltage source 60 and the reference voltage output terminal OUT. Reference voltage source 60 provides a fixed reference voltage $V_{REF}$ to switch SW6. As will become clear in view of the following description, the fixed reference voltage is selected to be equal to the desired output reference voltage OUT in the described embodiment. Control gates 50 and 51 are also coupled to switches SW9 and SW10, respectively. Switches SW9 and SW10 are also commonly coupled to erase voltage terminal $V_E$. Each of the switches SW1–SW11 is controlled by a corresponding switch control signal C1–C11. Each of the switch control signals C1–C11 is either activated, thereby closing (or turning on) the associated switch (i.e., placing the associated switch in a conductive state), or de-activated, thereby opening (or turning off) the associated switch (i.e., placing the associated switch in a non-conductive state). Each of switches SW1–SW11 is shown in an open state in FIG. 1 for purposes of illustration.

Figure 2:
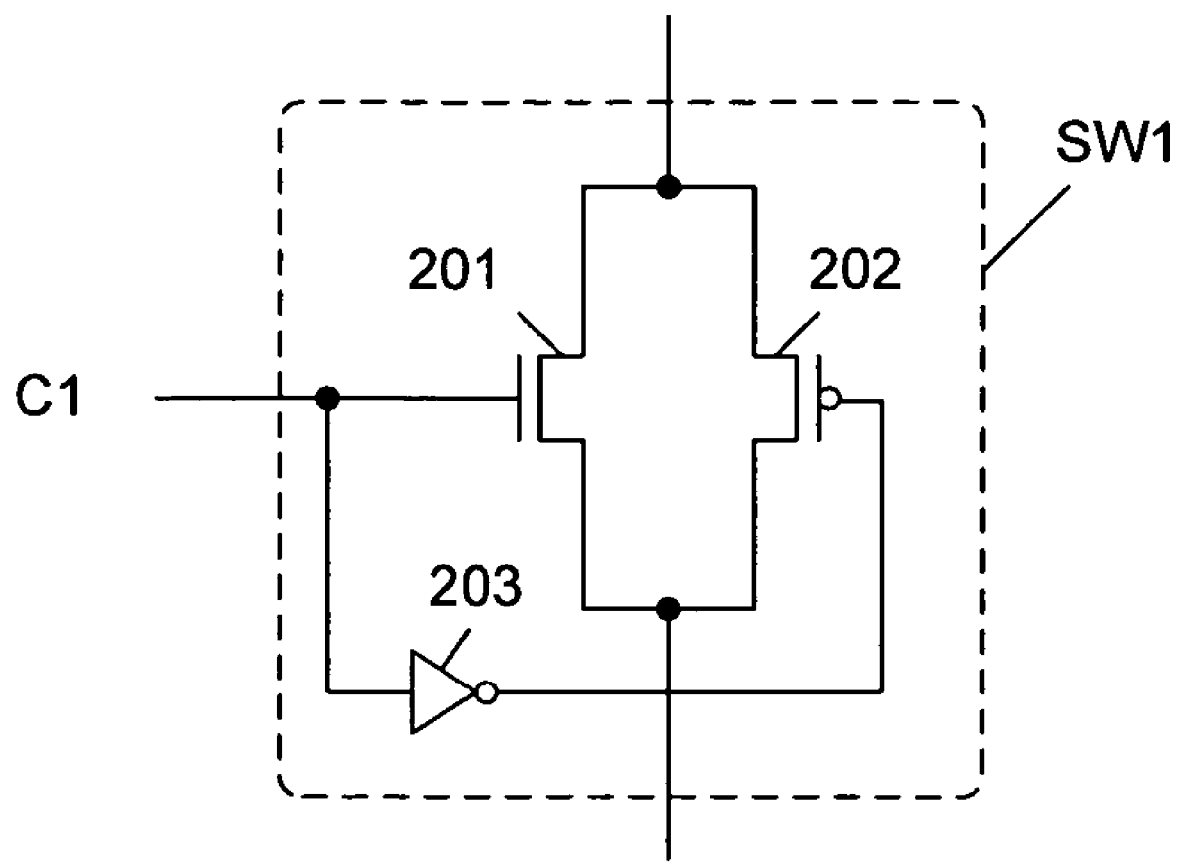
FIG. 2 is a circuit diagram illustrating a CMOS switch used in the voltage reference circuit of FIG. 1 in accordance with one embodiment of the present invention.

FIG. 2 is a circuit diagram illustrating switch SW1 in accordance with one embodiment of the present invention. In the described embodiment, switches SW1–SW11 are low-voltage CMOS switches, each having an identical construction. Low-voltage switch SW1 includes n-channel pass transistor 201, p-channel pass transistor 202 and inverter 203. Switch SW1 is controlled by a corresponding control signal C1, which is applied to the gate of n-channel pass transistor 201. Inverter 203 applies the inverse of the control signal C1 to the gate of p-channel pass transistor 202. When the control signal C1 is activated high, both of pass transistors 201 and 202 are turned on, thereby effectively enabling (closing) switch SW1. Conversely, when control signal C1 is deactivated low, both of pass transistors 201 and 202 are turned off, thereby effectively disabling (opening) switch SW1. Although FIG. 2 illustrates a switch used in one embodiment of the present invention, it is understood that other switches can be used in other embodiments.

In general, voltage reference circuit 100 operates as follows.

Non-volatile memory transistor 12 is initially controlled to have a reference threshold voltage. In one embodiment, floating gate 42 of non-volatile memory transistor 12 is initially discharged to a neutral state by ultra-violet (UV) irradiation (e.g., using a UV erase procedure of a standard EEPROM memory process). Note that the floating gates 40–41 of transistors 10 and 11 are typically discharged at the same time as floating gate 42. However, after the initial discharge is complete, the threshold voltage of non-volatile memory transistor 12 remains the same throughout the operation of reference voltage circuit 100. That is, there is no intentional charge transfer in or out of the floating gate 42 after the reference threshold voltage has been set in non-volatile memory transistor 12. As described in more detail below, the reference threshold voltage set in non-volatile memory transistor 12 is used as a reference during subsequent programming of non-volatile memory transistors 10–11. For this reason, non-volatile memory transistor 12 may be referred to as a reference memory transistor herein.

After the first threshold voltage has been set within reference memory transistor 12, an erase operation is performed on non-volatile memory transistors 10–11. The erase step is used to set an initial large negative charge (which corresponds to a high threshold voltage) on floating gates 40–41 of non-volatile memory transistors 10–11.

Non-volatile memory transistors 10 and 11 are then separately programmed. More specifically, the floating gates 40 and 41 of non-volatile memory transistors 10 and 11 are each programmed with a precise positive charge, in a closed loop cycle, using the threshold voltage of reference memory transistor 12 as a reference state. For example, non-volatile memory transistor 10 is programmed while coupled in parallel with reference memory transistor 12. During this programming step, the gate of NVM transistor 10 is coupled to ground, while the gate of reference memory transistor 12 is coupled to receive the reference voltage $V_{REF}$. As a result, NVM transistor 10 is programmed to have a first threshold voltage, which is associated with the reference voltage $V_{REF}$.

Non-volatile memory transistor 11 is also programmed while coupled in parallel with reference memory transistor 12. During this programming step, the gate of NVM transistor 11 and the gate of reference memory transistor 12 are both coupled to receive the reference voltage $V_{REF}$. As a result, NVM transistor 11 is programmed to have a second threshold voltage, which is associated with the reference voltage $V_{REF}$. By coupling reference memory transistor 12 in parallel with NVM transistor 10 and NVM transistor 11 during the two programming operations, optimal matching is obtained in the programming of NVM transistors 10 and 11.

A read operation is then enabled, wherein NVM transistors 10 and 11 are coupled to differential amplifier U1, thereby causing differential amplifier U1 to output a reference voltage which is equal to the exact difference between the first and second threshold voltages programmed in NVM transistors 10 and 11. In this manner, a stable and precise reference voltage is provided on a low impedance node.

As described in more detail below, voltage reference circuit 100 implements the erase, program and read operations by controlling the states of CMOS switches SW1-SW11 and controlling the applied voltages VP1, VP2 and VE (i.e., external signals).

The present invention substantially increases the precision of the programmed reference voltage, increases the stability of the programmed reference voltage over time, reduces the current consumption required to implement a reference voltage circuit, and preserves a small overall circuit area.

The operation of reference voltage circuit 100 will now be described in more detail. Voltage reference circuit 100 includes n-channel transistors N1 and N2, which help to form a current source. The current through n-channel transistors N1 and N2 is set by the BIAS.control signal applied to the gates of these transistors N1 and N2. In one embodiment, the BIAS control signal is generated by selecting a tap point along a string of diodes connected between the $V_{DD}$ voltage supply terminal and ground. Transistors N1 and N2 are sized such that transistor N2 carries twice the current as transistor N1.

Erase Operation

Figure 3:
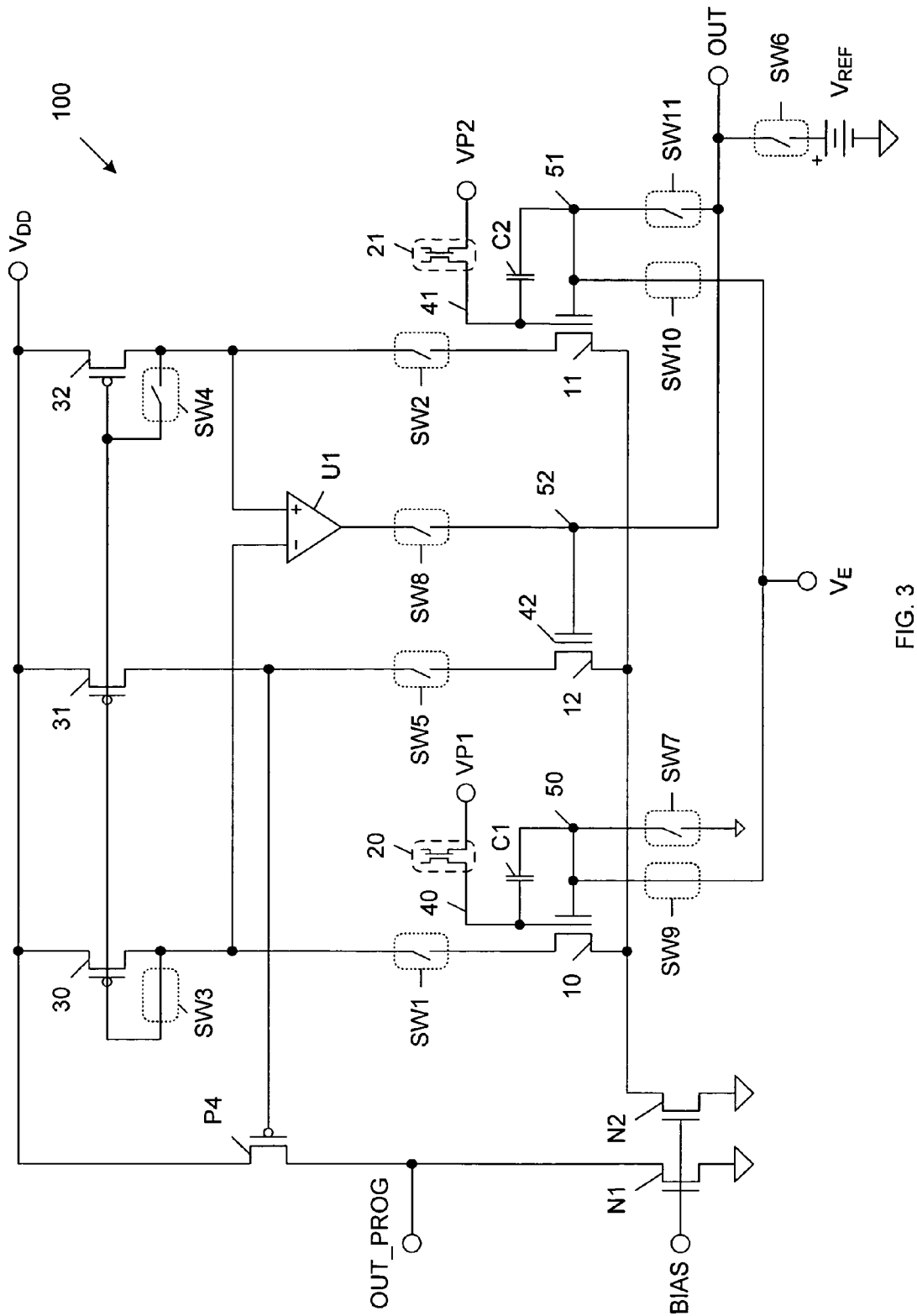
FIG. 3 is a circuit diagram of the voltage reference circuit of FIG. 1, configured to implement an erase operation.

FIG. 3 is a circuit diagram of voltage reference circuit 100, configured to implement an erase operation of non-volatile memory transistors 10 and 11. (This operation is referred to as an erase operation because of the similarities to an erase operation in an EEPROM memory.) At this time, the floating gate 42 of reference memory transistor 12 has already been programmed to a neutral state by UV exposure. Table 1 below summarizes the states of switches SW1–SW11 during the erase operation. Table 2 summarizes the states of voltages VP1, VP2, VE, OUT_PROG and OUT during the erase operation.

TABLE 1

SWITCH STATUS DURING ERASE

| SW1 | SW2 | SW3 | SW4 | SW5 | SW6 | SW7 | SW8 | SW9 | SW10 | SW11 |
|---|---|---|---|---|---|---|---|---|---|---|
| OFF | OFF | ON | OFF | OFF | OFF | OFF | OFF | ON | ON | OFF |

TABLE 2

VOLTAGE STATUS DURING ERASE

| VP1 | VP2 | VE | OUT_PROG | OUT |
|---|---|---|---|---|
| 0 Volts | 0 Volts | >10 Volts | LOW | Don't Care |

As illustrated in FIG. 3, switches SW9 and SW10 are closed, thereby coupling control gates 50 and 51 of non-volatile memory transistors 10 and 11 to receive the erase voltage $V_E$. In the described embodiment, the erase voltage $V_E$ is ramped up to a positive value greater than 10 Volts. During this operation, the VP1 and VP2 terminals are grounded, such that the voltage applied across the thin dielectrics of tunnel capacitors 20 and 21 result in Fowler-Nordheim tunneling currents that charge floating gates 40 and 41 with negative charge.

As a result, the threshold voltages of non-volatile memory transistors 10 and 11 are increased to relatively large values, typically in the range of 2 to 8 Volts. The final potential of floating gates 40–41 and the corresponding threshold voltages of non-volatile memory transistors 10 and 11 are dependent only on the highest value of the erase voltage pulse, $V_E$. The precise threshold voltages of non-volatile memory transistors 10 and 11 are not critical in this step, as these threshold voltages only set an acceptable initial state before these non-volatile memory transistors 10 and 11 are programmed.

Program NVM Transistor 10

Figure 4:
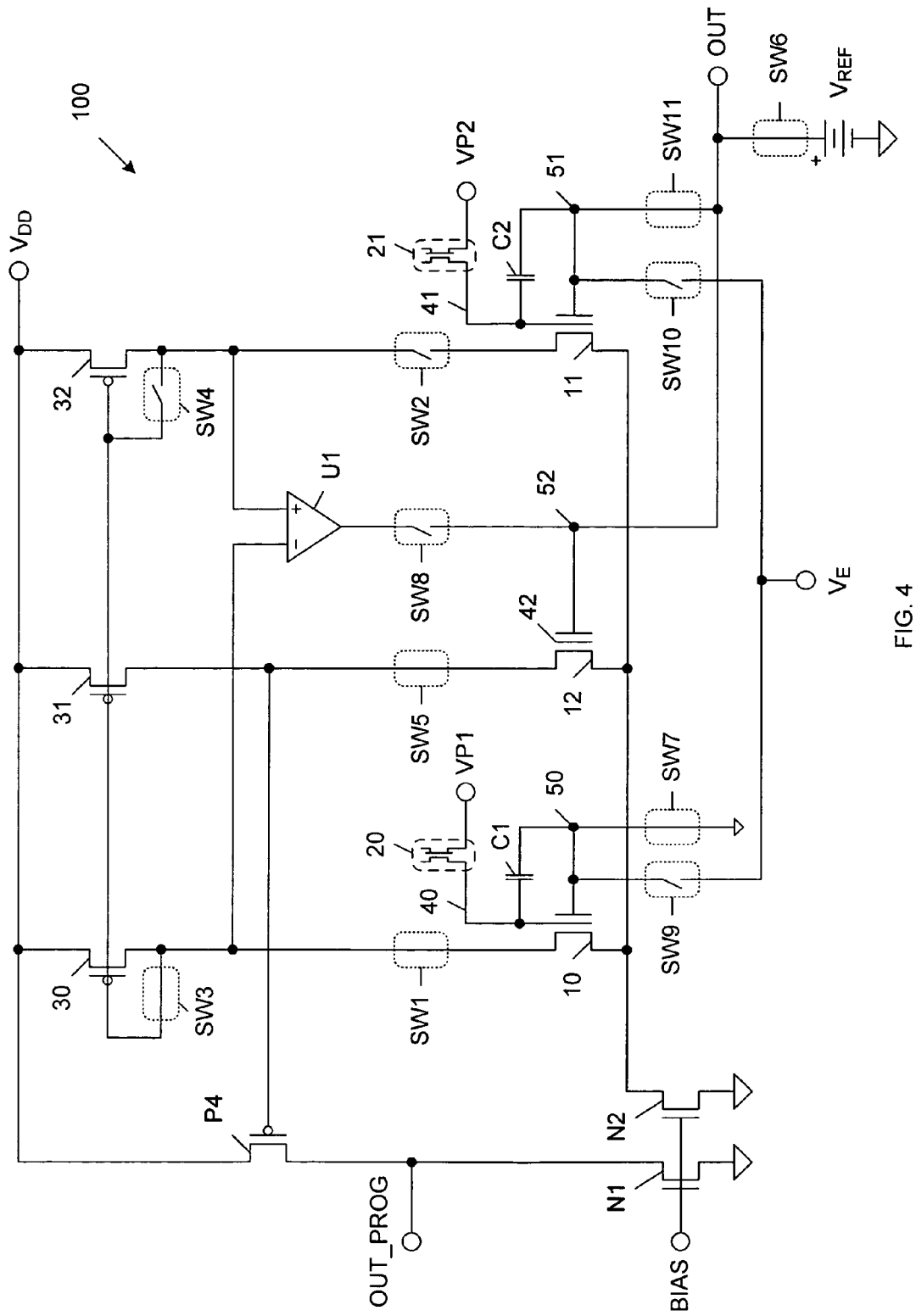
FIG. 4 is a circuit diagram of the voltage reference circuit of FIG. 1, configured to program the threshold voltage of a first non-volatile memory transistor, in a differential combination with a reference transistor.

FIG. 4 is a circuit diagram of reference voltage circuit 100, configured to program the threshold voltage of non-volatile memory transistor 10, in a differential combination with reference transistor 12. (This operation is referred to as a program operation because of the similarities to a program operation in an EEPROM memory.) At this time, non-volatile memory transistor 10 has already been erased as described above in connection with FIG. 3. Table 3 below summarizes the states of switches SW1–SW11 during the program operation of non-volatile memory transistor 10. Table 4 summarizes the states of voltages VP1, VP2, VE, OUT_PROG and OUT during the program operation of non-volatile memory transistor 10.

TABLE 3

SWITCH STATUS DURING PROGRAM OF TRANSISTOR 10

| SW1 | SW2 | SW3 | SW4 | SW5 | SW6 | SW7 | SW8 | SW9 | SW10 | SW11 |
|---|---|---|---|---|---|---|---|---|---|---|
| ON | OFF | ON | OFF | ON | ON | ON | OFF | OFF | OFF | ON |

TABLE 4

VOLTAGE STATUS DURING PROGRAM OF TRANSISTOR 10

| VP1 | VP2 | VE | OUT_PROG | OUT |
|---|---|---|---|---|
| >10 Volts | Don't Care | Don't Care | HI to LOW | $V_{REF}$ |

As illustrated in FIG. 4, switches SW1 and SW5 are closed, thereby coupling non-volatile memory transistors 10 and 12 in parallel paths (in a current mirror configuration). Switch SW2 is open, such that non-volatile memory transistor 11 is not connected in parallel with transistors 10 and 12. Switches SW9 and SW10 are open, thereby de-coupling the erase voltage VE from control gates 50 and 51. Switch SW7 is closed, thereby coupling the control gate 50 of non-volatile memory transistor 10 to a second reference voltage. In the described embodiment, the second reference voltage is ground (0 Volts), although this is not necessary. Switches SW6 and SW11 are closed, thereby coupling the first reference voltage $V_{REF}$ to control gates 51–52 of non-volatile memory transistors 11–12 and to output terminal OUT. Switch SW8 is open, thereby decoupling the output of differential amplifier U1 from the output terminal OUT. Switch SW3 is closed and switch SW4 is open, thereby coupling the drain of p-channel transistor 30 to the gates of p-channel transistors 30–32.

When voltage reference circuit 100 has been configured in the above-described manner, the reference voltage $V_{REF}$ is sufficiently high to cause non-volatile memory transistor 12 to turn on. As a result, the voltage on the gate of p-channel transistor P1 is pulled down toward the ground supply voltage through transistors 12 and N2. Under these conditions, p-channel transistor P1 turns on, thereby coupling the OUT_PROG terminal to the $V_{DD}$ supply voltage, and pulling up the voltage on the OUT_PROG terminal to logic high state. The ground supply voltage applied to the control gate 50 of non-volatile memory transistor 10 causes this transistor 10 to initially be in a high impedance state. At this time, the current flowing through non-volatile memory transistor 12 is greater than the current flowing through non-volatile memory transistor 10.

A high voltage ramp is then applied to programming voltage terminal VP1 (while programming voltage terminal VP2 is grounded). In the described embodiment, the programming voltage on node VP1 is ramped up to a positive value greater than 10 Volts. Because control gate 50 is grounded, the voltage applied across the thin dielectric of tunnel capacitor 20 results in Fowler-Nordheim tunneling current that removes negative charge from floating gate 40. As a result, the threshold voltage of non-volatile memory transistor 10 is reduced. Note that the high voltage applied across tunnel capacitor 20 has different polarities during the erase operation (FIG. 3) and the program operation (FIG. 4).

As more negative charge is removed from floating gate 40, the threshold voltage of transistor 10 continues to be reduced, thereby resulting in increased current flow through non-volatile memory transistor 10. This increased current flow causes the voltage applied to the gates of p-channel transistors 30 and 31 to decrease (i.e., be pulled toward ground). The programming of non-volatile memory transistor 10 continues until the drain current through NVM transistor 10 is equal to the drain current through reference memory transistor 12. When the drain current of NVM transistor 10 becomes greater than the drain current through reference memory transistor 12, transistors 30 and 31 enter a conductive state (i.e., turn on). As a result, the voltage at the drain of p-channel transistor 31 is pulled up toward the $V_{DD}$ supply voltage, thereby turning off transistor P1 and causing the OUT_PROG signal to transition from a logic high state to a logic low state. In response to the low state of the OUT_PROG signal, the associated programming logic (described in more detail below for an alternate embodiment of the invention) turns off the high voltage ramp applied on terminal VP1. At this time, the threshold voltage of non-volatile memory transistor 10 is programmed to a value which precisely represents the voltage provided on the control gate 50 during programming, which in the present example is 0 Volts. It is important to note that the threshold voltage of NVM transistor 10 is set while the control gate 52 of reference memory transistor 12 is held at the reference voltage $V_{REF}$.

Program Transistor 11

Figure 5:
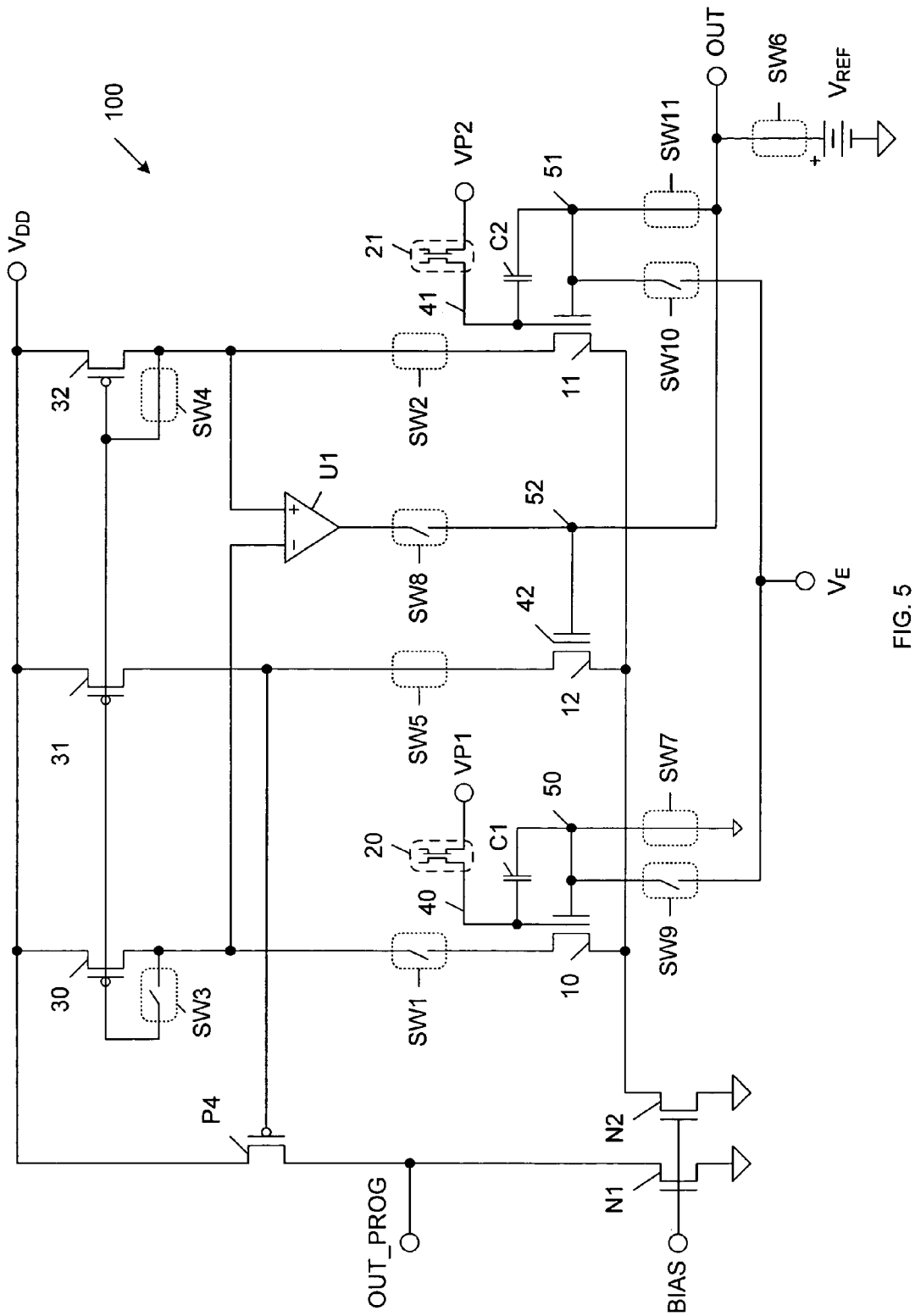
FIG. 5 is a circuit diagram of the voltage reference circuit of FIG. 1, configured to program the threshold voltage of a second non-volatile memory transistor, in a differential combination with a reference transistor.

FIG. 5 is a circuit diagram of reference voltage circuit 100, configured to program the threshold voltage of non-volatile memory transistor 11, in a differential combination with reference transistor 12. At this time, non-volatile memory transistor 11 has already been erased as described above in connection with FIG. 3. Table 5 below summarizes the states of switches SW1–SW11 during the program operation of non-volatile memory transistor 11. Table 6 summarizes the states of voltages VP1, VP2, VE, OUT_PROG and OUT during the program operation of non-volatile memory transistor 11.

TABLE 5

SWITCH STATUS DURING PROGRAM OF TRANSISTOR 11

| SW1 | SW2 | SW3 | SW4 | SW5 | SW6 | SW7 | SW8 | SW9 | SW10 | SW11 |
|---|---|---|---|---|---|---|---|---|---|---|
| OFF | ON | OFF | ON | ON | ON | ON | OFF | OFF | OFF | ON |

TABLE 6

VOLTAGE STATUS DURING PROGRAM
OF TRANSISTOR 11

| VP1 | VP2 | VE | OUT_PROG | OUT |
|---|---|---|---|---|
| Don't Care | >10 Volts | Don't Care | HI to LOW | $V_{REF}$ |

As illustrated in FIG. 5, switches SW2 and SW5 are closed, thereby coupling non-volatile memory transistors 11 and 12 in parallel paths (in a current mirror configuration). Switch SW1 is open, such that non-volatile memory transistor 10 is not connected in parallel with transistors 11 and 12. Switches SW9 and SW10 are open, thereby de-coupling the erase voltage $V_E$ from control gates 50 and 51. Switch SW7 is closed, thereby coupling the control gate 50 of non-volatile memory transistor 10 to the second reference voltage (i.e., ground). Switches SW6 and SW11 are closed, thereby coupling the first reference voltage $V_{REF}$ to control gates 51–52 of non-volatile memory transistors 11–12 and to output terminal OUT. Switch SW8 is open, thereby decoupling the output of differential amplifier U1 from the output terminal OUT. Switch SW3 is open and switch SW4 is closed, thereby coupling the drain of p-channel transistor 32 to the gates of p-channel transistors 30–32.

When reference voltage circuit 100 has been configured in the above-described manner, the first reference voltage $V_{REF}$ is sufficiently high to cause non-volatile memory transistor 12 to turn on. As a result, the voltage on the gate of p-channel transistor P1 is pulled down toward the ground supply voltage through transistors 12 and N2. Under these conditions, p-channel transistor P1 is in a relatively low impedance state, thereby coupling the OUT_PROG terminal to the $V_{DD}$ supply voltage, and pulling up the voltage on the OUT_PROG terminal to logic high state. The first reference voltage $V_{REF}$ applied to the control gate 51 of non-volatile memory transistor 11 causes this transistor 11 to initially be in a high impedance state. At this time, the current flowing through non-volatile memory transistor 12 is greater than the current flowing through non-volatile memory transistor 11.

A high voltage ramp is then applied to programming voltage terminal VP2 (while programming voltage terminal VP1 is grounded). In the described embodiment, the programming voltage on node VP2 is ramped up to a positive value greater than 10 Volts. Because control gate 51 is coupled to the first reference voltage $V_{REF}$, the voltage applied across the thin dielectric of tunnel capacitor 21 results in Fowler-Nordheim tunneling current that removes negative charge from floating gate 41. As a result, the threshold voltage of non-volatile memory transistor 11 is reduced. Note that the high voltage applied across tunnel capacitor 21 is not as large as the high voltage applied across tunnel capacitor 20 during the programming of non-volatile memory transistor 10 (FIG. 4).

As more negative charge is removed from floating gate 41, the threshold voltage of transistor 11 continues to be reduced, thereby resulting in increased current flow through non-volatile memory transistor 11. This increased current flow causes the voltage applied to the gates of p-channel transistors 31 and 32 to decrease (i.e., be pulled toward ground). The programming of non-volatile memory transistor 11 continues until the drain current through transistor 11 is equal to the drain current through reference transistor 12. When the drain current of transistor 11 becomes greater than the drain current through transistor 12, transistors 31 and 32 enter a conductive state (i.e., turn on). As a result, the voltage at the drain of p-channel transistor 31 is pulled up toward the $V_{DD}$ supply voltage, thereby turning off transistor P1 and causing the OUT_PROG signal to transition from a logic high state to a logic low state. In response to the low state of the OUT_PROG signal, the associated programming logic (described in more detail below in connection with a different embodiment) turns off the high voltage ramp applied on terminal VP2. At this time, the threshold voltage of non-volatile transistor 11 is programmed to a value which precisely represents the voltage provided on the control gate 51 during programming, which in the present example is $V_{REF}$ Volts. (Recall that non-volatile memory transistor 10 was programmed to a threshold of 0 Volts.)

Although the above described example describes non-volatile memory transistor 10 being programmed before non-volatile memory transistor 11, it is understood that non-volatile memory transistor 11 can be programmed before non-volatile memory transistor 10 in other embodiments.

Read Operation

Figure 6:
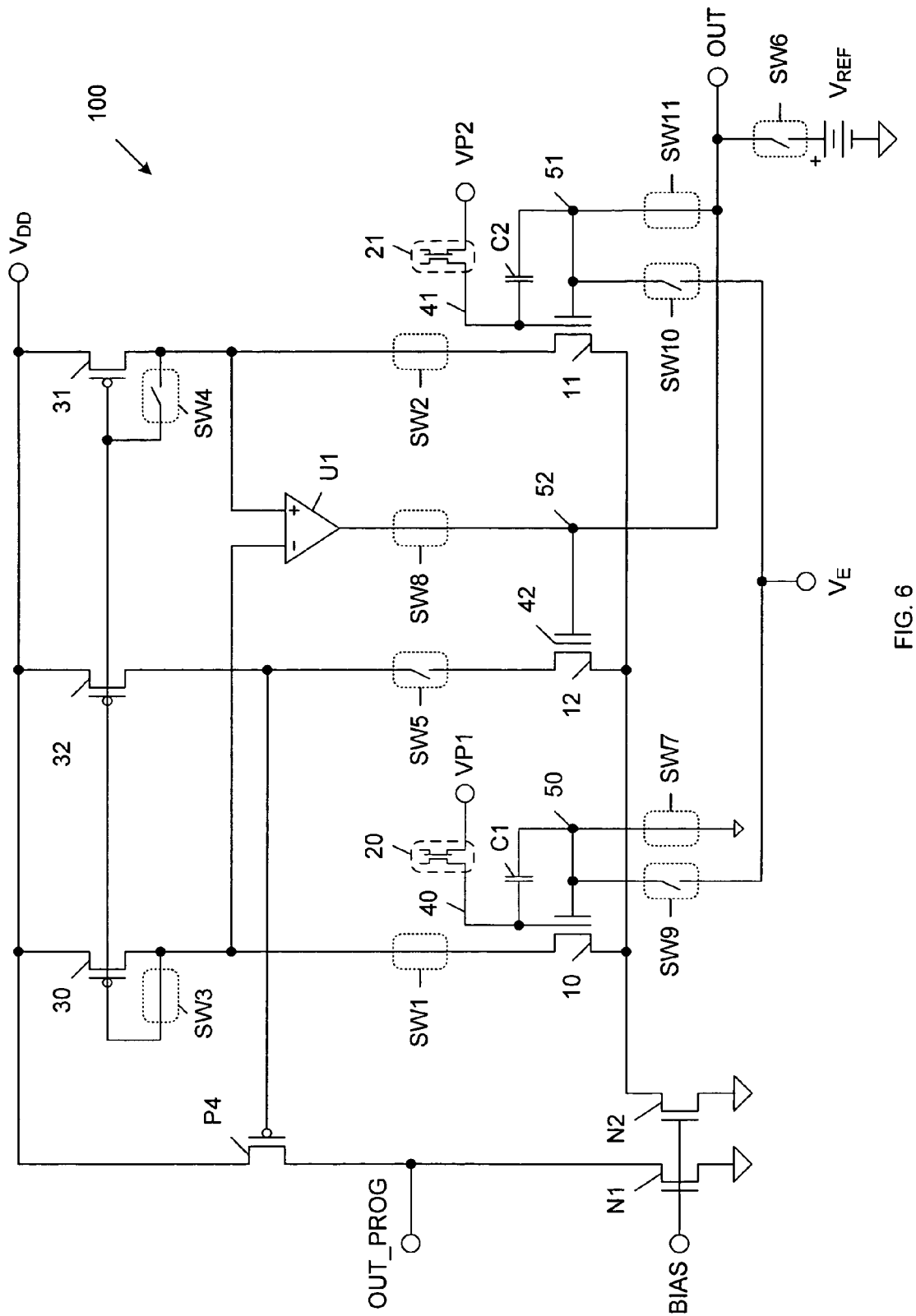
FIG. 6 is a circuit diagram of the voltage reference circuit of FIG. 1, configured to read the difference between the programmed threshold voltages of the transistors programmed in FIGS. 4 and 5, and in response, provide a single ended output reference voltage.

FIG. 6 is a circuit diagram of reference voltage circuit 100, configured to read the difference in the programmed threshold voltages of transistors 10 and 11, and in response, provide a single ended output reference voltage $V_{REF}$. (This operation is referred to as a read operation because of the similarities to a read operation in an EEPROM memory.) At this time, non-volatile memory transistors 10 and 11 have already been programmed as described above in connection with FIGS. 4 and 5. Table 7 below summarizes the states of switches SW1–SW11 during the read operation of non-volatile memory transistors 10–11. Table 8 summarizes the states of voltages VP1, VP2, VE, OUT_PROG and OUT during the read operation of non-volatile memory transistors 10–11.

TABLE 7

SWITCH STATUS DURING READ OF TRANSISTORS 10–11

| SW1 | SW2 | SW3 | SW4 | SW5 | SW6 | SW7 | SW8 | SW9 | SW10 | SW11 |
|---|---|---|---|---|---|---|---|---|---|---|
| ON | ON | ON | OFF | OFF | OFF | ON | ON | OFF | OFF | ON |

TABLE 8

VOLTAGE STATUS DURING READ
OF TRANSISTORS 10–11

| VP1 | VP2 | VE | OUT_PROG | OUT |
|---|---|---|---|---|
| OUT | OUT | Don't Care | LOW | $V_{REF}$ |

As illustrated in FIG. 6, switches SW1 and SW2 are closed, thereby coupling non-volatile memory transistors 10 and 11 in parallel paths (in a current mirror configuration). Switch SW5 is open, such that reference memory transistor 12 is not connected in parallel with transistors 10 and 11.

That is, the circuit branch including transistors 32 and 12, which is used for threshold programming, is disabled during the read operation. Switches SW9 and SW10 are open, thereby de-coupling the erase voltage $V_E$ from control gates 50 and 51. Switch SW7 is closed, thereby coupling the control gate 50 of non-volatile memory transistor 10 to the second reference voltage (i.e., ground). Switch SW11 is closed, thereby coupling control gate 51 to output terminal OUT. Switch SW8 is closed, thereby coupling the output of differential amplifier U1 to output terminal OUT. Switch SW3 is closed and switch SW4 is open, thereby coupling the drain of p-channel transistor 30 to the gates of p-channel transistors 30–32. Switch SW6 is open, thereby decoupling the first reference voltage supply $V_{REF}$ from the output terminal OUT. Additional switches (not shown) couple the programming terminals VP1 and VP2 to output terminal OUT.

When reference voltage circuit 100 has been configured in the above-described manner, the second reference voltage (i.e., ground) is applied to control gate 50 of non-volatile memory transistor 10. Because the voltage applied to control gate 50 is equal to the programmed threshold voltage of transistor 10, this transistor 10 enters a conductive state. As a result, a current flows through transistor 10, and a first voltage is developed at the drain of this transistor 10. This first voltage is applied to an input terminal of differential amplifier U1. P-channel transistors 30 and 31 force identical currents in the drains of transistors 10 and 11, respectively. Differential amplifier U1 biases transistor 11 such that the drain currents of transistors 10 and 11 are equal. This forces the output node OUT to a voltage that exactly compensates the difference between the programmed threshold voltages of transistors 10 and 11. That is, differential amplifier U1 provides an output signal OUT having a voltage representative of the difference between the voltage on the drain of transistor 10 and the voltage on the drain of transistor 11.

Due to the perfect symmetry of the read circuit, the output reference voltage OUT has a very low temperature coefficient (TC), as first and second order effects are canceled out.

Although not shown in FIG. 6, the programming voltage terminals VP1 and VP2 are connected to the output voltage OUT during the reference read operation, is which very close to the floating gate voltage level. This way the voltage on the thin oxide of tunnel capacitors 20 and 21 is kept very low and the oxide leakage is practically eliminated.

The difference between the respective threshold voltages programmed into the transistors 10, 11 with respect to FIGS. 4 and 5 (i.e., $V_{REF}-0V=V_{REF}$), is output during the read operation. The reference voltage output by the voltage reference circuit 100 can be set to any value by adjusting the threshold voltages programmed into NVM transistors 10 and 11, so that the difference between these threshold voltages is equal to the desired output reference voltage. It is not necessary that one of the programmed voltages be 0 Volts, although this may simplify the programming operation.

The erase and programming operations can be repeated as many times as needed. The reference cycling endurance is related to the endurance of the EEPROM memory made with the same process. This allows to the reprogramming of the reference voltage at least 1,000 times, without any detrimental effect.

The disclosed voltage reference circuit 100 may be implemented in any integrated circuit requiring a stable reference voltage. The programming may be done before singulation of the integrated circuit from a wafer, or afterwards, such as after assembly of the integrated circuit into a package.

The CMOS logic needed to actuate switches SW1-SW11, to apply the high voltage pulses on VP1, VP2 and VE, and to close the programming loops from OUT_PROG to VP1 and VP2 is straightforward and could be easily implemented by persons of ordinary skill in the art in various ways.

A second embodiment of the invention will now be described.

Figure 7:
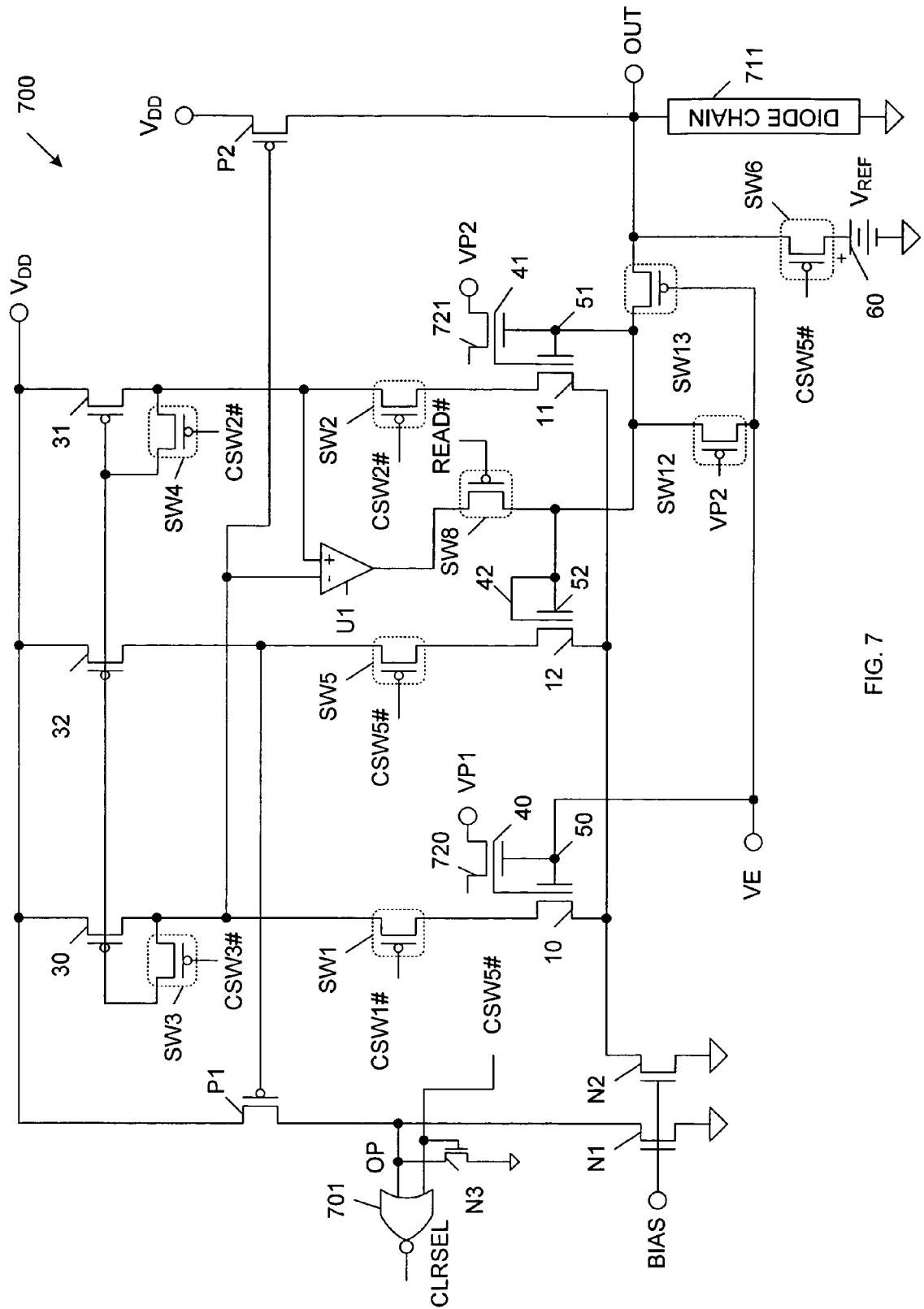
FIG. 7 is a circuit diagram of a CMOS voltage reference circuit in accordance with a second embodiment of the present invention.

FIG. 7 is a circuit diagram of a CMOS voltage reference circuit 700 in accordance with a second embodiment of the present invention. Because voltage reference circuit 700 is similar to voltage reference circuit 100 (FIG. 1), similar elements in FIGS. 1 and 7 are labeled with similar reference numbers. Thus, voltage reference circuit 700 includes NVM transistors 10–12 (which have floating gates 41–42 and control gates 50–52, respectively), switches SW21–SW6 and SW8, differential amplifier U1, p-channel transistors 30–32 and P1, n-channel transistors N1 and N2, and reference voltage source 60. In addition, voltage reference circuit 700 includes NOR gate 701, diode chain 711, NVM transistors 720–721, switches SW12 and SW13, n-channel transistor N3, and p-channel transistor P2.

In the present embodiment, switches SW1–SW5, SW8, SW12 and SW13 are implemented by p-channel transistors. In an alternate embodiment, these switches can be implemented by other circuitry. As described in more detail below, switches SW1, SW2, SW3, SW4, SW5, SW8, SW12 and SW13 are controlled by signals CSW1# PROGSW2#, CSW2# PROG1#, CSW3# PROG2#, CSW2# PROG1#, CSW5# ENABLE#, READ#, VP2 PROGDRAIN1, and VE GATEPOLY2, respectively.

Figure 8:
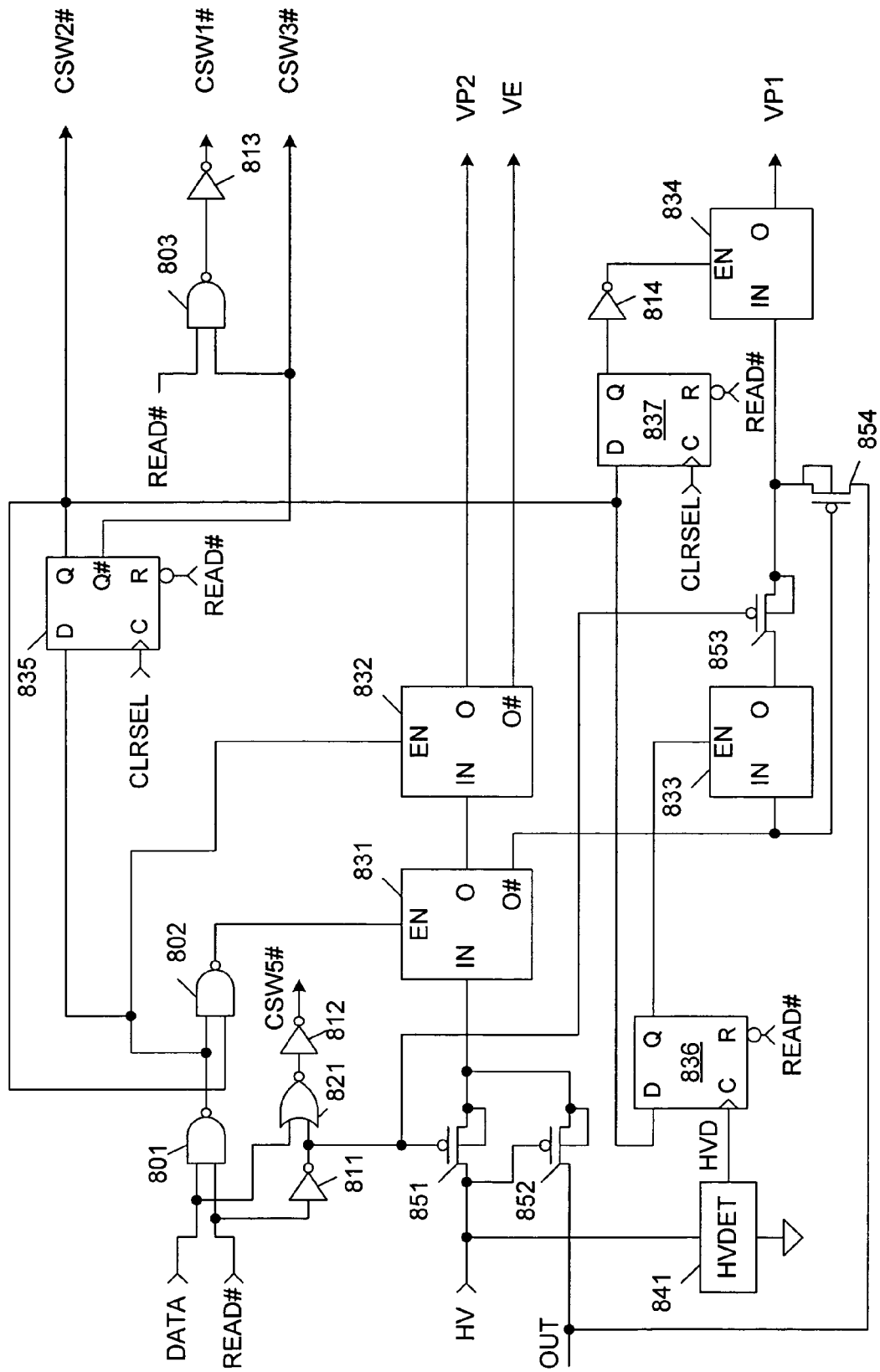
FIG. 8 is a circuit diagram of a control circuit used to generate signals used to operate the voltage reference circuit of FIG. 7, in accordance with one embodiment of the present invention.

NOR gate 701 is coupled to receive the output program signal OP and the CSW5# signal. N-channel transistor N3 has a gate coupled to receive the CSW5# signal, a drain coupled to receive the output program signal OP, and a source coupled to ground. The output terminal of NOR gate 701 provides a clear signal CLRSEL, which is provided to the associated control circuit 800 (FIG. 8).

NVM transistor 720 shares floating gate 40 and control gate 50 with NVM transistor 10, such that NVM transistor 720 effectively replaces capacitor C1 and tunnel capacitor 20 (FIG. 1). The drain of NVM transistor 720 is coupled to receive a drain programming voltage VP1 from the associated control circuit. The control gate 50 of NVM transistor 10 and 720 is coupled to receive the VE control voltage from the associated control circuit.

Similarly, NVM transistor 721 shares floating gate 41 and control gate 51 with NVM transistor 11, such that NVM transistor 721 effectively replaces capacitor C2 and tunnel capacitor 21 (FIG. 1). The drain of NVM transistor 721 is coupled to receive a drain programming voltage VP2 from the associated control circuit. The control gate 51 of NVM transistor 11 and 721 is coupled to the output terminal OUT through switch SW13, and to the VE terminal through switch SW12. Note that the floating gate 42 and control terminal 52 of NVM transistor 12 are commonly connected.

P-channel transistor P2, which is coupled between the VDD voltage supply and the output terminal OUT, has a gate coupled to the drain of p-channel transistor 30. Diode chain 711, which includes 10 diodes in the described example, is forward biased from the output terminal OUT to ground. Thus, when the voltage on the output terminal OUT exceeds ten diode voltage drops, diode chain 711 becomes conductive, thereby limiting the voltage on output terminal OUT. When the voltage on the drain of p-channel transistor 30 has a logic low state, p-channel transistor P2 turns on, thereby applying the VDD supply voltage to the output terminal OUT.

FIG. 8 is a circuit diagram of a CMOS control circuit 800 used to control voltage reference circuit 700, in accordance with one embodiment of the present invention. Control circuit 800 includes NAND gates 801–803, inverters 811–814, NOR gate 821, high-voltage switches 831–834, D-Q flip-flops 835–837, high voltage detector 841 and p-channel transistors 851–854, which are connected as illustrated. Control circuit 800 operates in response to external signals DATA, READ# and HV, as well as the CLRSEL generated by voltage reference circuit 700.

Figure 9:
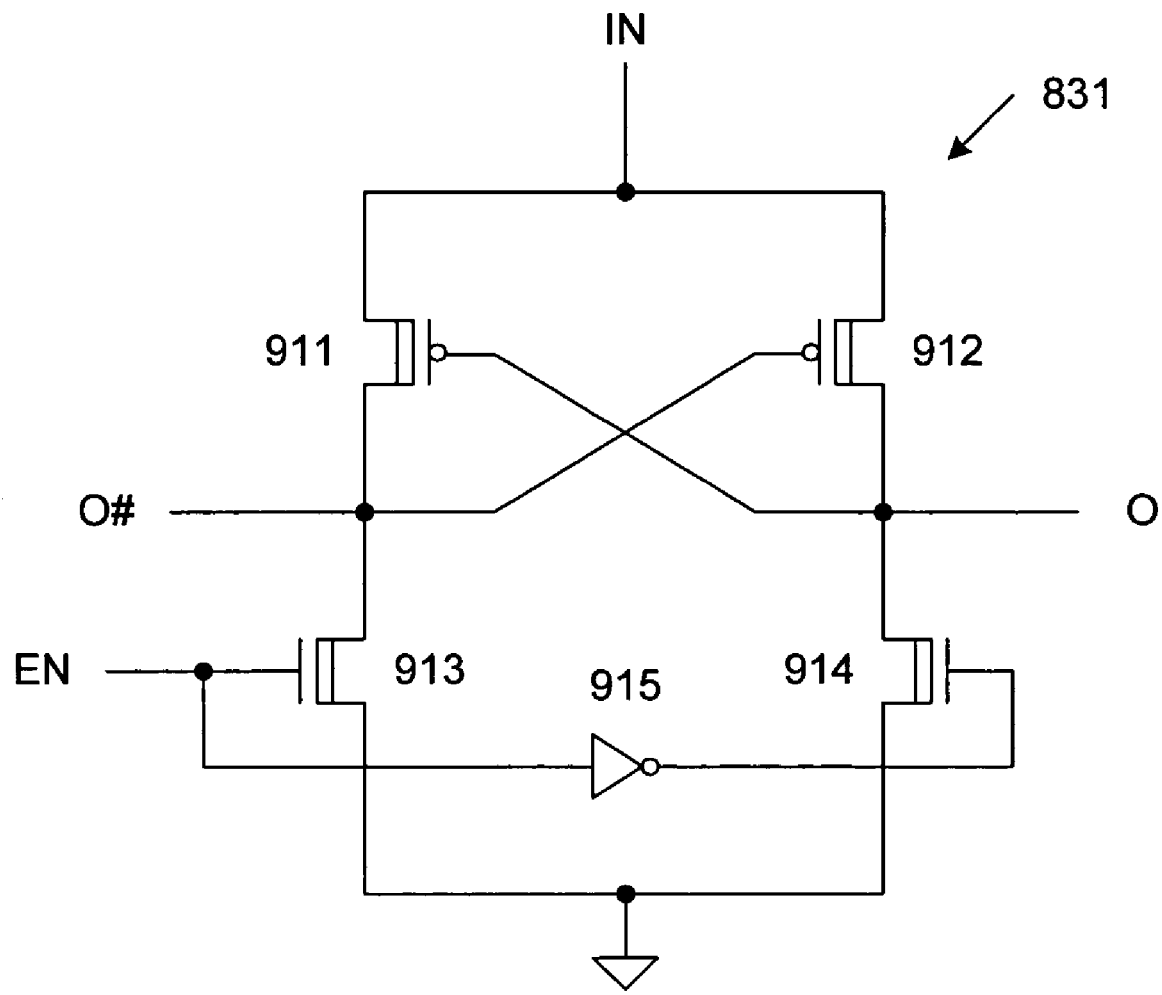
FIG. 9 is a circuit diagram illustrating a high voltage switch used in the control circuit of FIG. 8, in accordance with one embodiment of the present invention.

FIG. 9 is a circuit diagram of high-voltage switch 831, which is used in one embodiment of the present invention. High-voltage switches 831–834 are identical in the described embodiment. High-voltage switches 831–834 are used to apply high voltages to voltage reference circuit 800. High voltage switch 831 includes thick-dieletric p-channel transistors 911–912, thick-dielectric n-channel transistors 913–914 and inverter 915. High voltage switch 831 is controlled by a corresponding control signal EN, which is applied to the gate of n-channel transistor 913. Inverter 915 applies the inverse of the control signal EN to the gate of n-channel transistor 914. When the control signal EN is activated high, transistors 912 and 913 are turned on, and transistors 911 and 914 are turned off, thereby coupling the input terminal IN to the output terminal O, and coupling the output terminal O# to ground. Conversely, when control signal EN is deactivated low, transistors 912 and 913 are turned off, and transistors 911 and 914 are turned on, thereby coupling the input terminal IN to the output terminal O#, and coupling the output terminal O to ground.

The operation of control circuit 800 and voltage reference circuit 700 will now be described.

Figure 10:
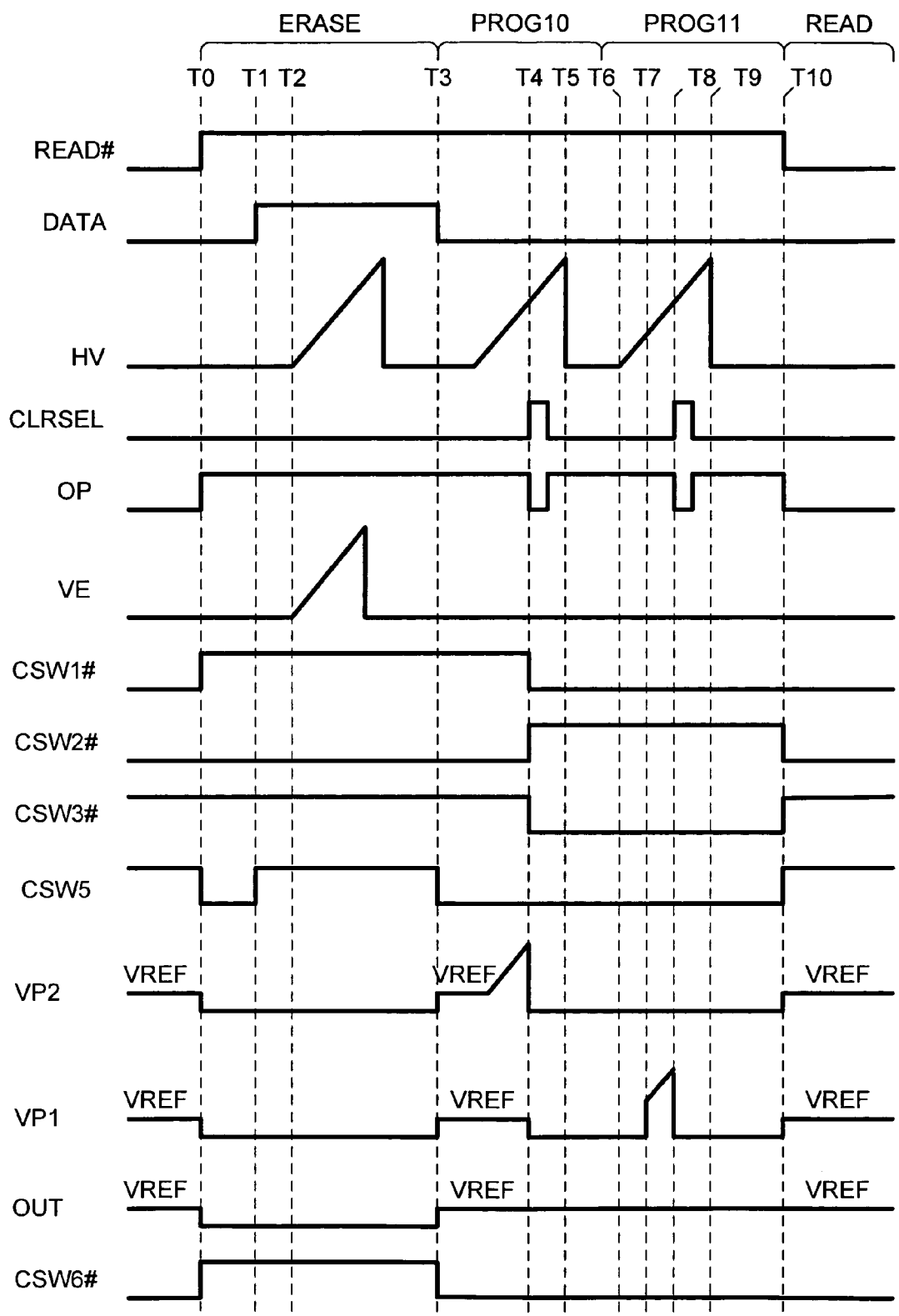
FIG. 10 is a waveform diagram illustrating the operation of the voltage reference circuit of FIG. 7 and the control circuit of FIG. 8 in accordance with one embodiment of the present invention.

FIG. 10 is a waveform diagram illustrating the operation of voltage reference circuit 700 and control circuit 800 in accordance with one embodiment of the present invention. Prior to time T0, the DATA, READ# and HV signals all have a logic '0' state (e.g., 0 Volts). (As will become apparent in view of the following description, this represents the read state.) The logic '0' state of the READ# signal causes switch SW8 to turn on, thereby coupling the differential amplifier U1 to the output terminal OUT. The logic '0' state of the READ# signal also causes flip-flops 835, 836 and 837 to be reset, such that the Q outputs of these flip-flops provide logic '0' output signals (and the Q# output of flip-flop 835 provides a logic '1' output signal). The logic '0' value provided at the Q output of flip-flop 835 is routed as the CSW2# signal, thereby turning on switches SW2 and SW4. The logic '1' value provided at the Q# output of flip-flop 835 is routed as the CSW3# signal, thereby turning off switch SW3. NAND gate 803 and inverter 813 provide a CSW1# signal having a logic '0' value in response to the logic '0' state of the READ# signal. Switch SW1 is turned on in response to the logic '0' state of the CSW1# signal. As a result, NVM transistors 10 and 11 are connected in parallel circuit branches.

The logic '0' signal provided at the Q output terminal of flip-flop 836 is provided to the enable terminal EN of high-voltage switch 833. As a result, the output terminal O of this high-voltage switch 833 is coupled to ground. The logic '0' signal provided at the Q output terminal of flip-flop 837 is inverted by inverter 814, such that a logic '1' signal is provided to the enable terminal EN of high voltage switch 834. As a result, a conductive path exists between the input terminal IN and the output terminal O of high-voltage switch 834.

Inverters 811–812 and NOR gate 821 provide a CSW5# signal having a logic '1' state in response to the logic '0' states of the READ# and DATA signals. The logic '1' state of the CSW5# signal turns off switch SW5, thereby effectively de-coupling reference memory transistor 12 from the parallel circuit branches including NVM transistors 11 and 12. The logic '1' state of the CSW5# signal also causes NOR gate 701 to provide a CLRSEL signal having a logic '0' state. NAND gate 801 provides a logic '1' value to the enable terminal of high-voltage switch 832 in response to the logic '0' states of the DATA and READ# signals. In response, high-voltage switch 832 provides a conductive path between its input terminal IN and output terminal O, and provides a logic '0' signal at its O# output terminal. Consequently, the VE signal has a logic '0' value.

NAND gate 802 provides a logic '1' value to the enable terminal EN of high-voltage switch 831 in response to the logic '0' states of the DATA, READ# and CSW2# signals. In response, high-voltage switch 831 provides a conductive path between its input terminal IN and output terminal O, and provides a logic '0' signal on its O# terminal. As result, p-channel transistor 854 is turned on.

Inverter 811 provides a logic '1' signal to the gates of p-channel transistors 851 and 853 in response to the logic '0' state of the READ# signal, thereby turning off these transistors. The logic '0' state of the HV signal causes p-channel transistor 852 to turn on.

Under these conditions, the VP2 terminal is connected to the output terminal OUT through high voltage switches 831–832 and p-channel transistor 852. The VP1 terminal is also connected to the output terminal OUT through high-voltage switch 834 and p-channel transistor 854.

Switch SW6 is turned on (closed) in response to the logic '0' state of the CSW6# signal, such that the output terminal OUT, the VP1 terminal and the VP2 terminal are coupled to receive the reference voltage $V_{REF}$ from reference voltage supply 60. In the described embodiment, the circuitry for generating the CSW6# signal is not illustrated, as this signal is generated external to control circuit 800 and voltage reference circuit 700.

At time T0, the READ# signal transitions from a logic '0' state to a logic '1' state. In response, inverters 811–812 and NOR gate 821 provide a CSW5# signal that transitions to a logic '0' state. The logic '0' state of the CSW5# signal causes switch SW5 to turn on, thereby coupling the gate of p-channel transistor P1 to ground (through turned on reference memory transistor 12 and transistor N2). Under these conditions, p-channel transistor P1 turns on, thereby pulling the output programming signal OP up to a logic '1' state. As a result, NOR gate 701 continues to provide a CLRSEL signal having a logic '0' state.

The logic '1' state of the READ# signal also causes NAND gate 803 and inverter 813 to provide a CSW1# signal that transitions to a logic '1' state. The logic '1' state of the CSW1# signal causes switch SW1 to turn off, thereby de-coupling NVM transistor 10 from parallel connection with NVM transistor 11 (and reference memory transistor 12).

The logic '1' state of the READ# signal also causes inverter 811 to provide a logic '0' value to the gates of p-channel transistors 851 and 853, thereby turning on these transistors. As a result, the VP2 terminal is connected to the HV terminal through high-voltage switches 831–832 and turned on p-channel transistor 851. Note that the HV terminal is maintained at the ground supply voltage at this time. The VP1 terminal is connected to ground through high-voltage switches 833–834 and turned on p-channel transistor

853. The output terminal OUT is also connected to ground through high-voltage switch 833 and turned on p-channel transistors 853–854.

Thus, prior to time T0, voltage reference circuit 700 is configured with NVM transistors 10 and 11 coupled in parallel circuit branches, with the control gate 50 of NVM transistor 10 coupled to ground, the control gate 51 of NVM transistor 11 coupled to the output terminal OUT and the output terminal of differential amplifier U1. That is, voltage reference circuit 700 is configured to implement a read operation of NVM transistors 10 and 11, wherein the voltage on the output terminal OUT is equal to the difference between the threshold voltages of NVM transistors 10 and 11.

At time T1, the DATA signal transitions from a logic '0' state to a logic '1' state. In response, inverters 811–812 and NOR gate 821 provide a CSW5# signal that transitions to a logic '1' state. The logic '1' state of the CSW5# signal causes switch SW5 to turn off. The logic '1' sate of the CSW5# signal also causes NOR gate 701 to continue providing a CLRSEL signal having a logic '0' state.

The logic '1' state of the DATA signal also causes NAND gate 801 to provide a logic '0' signal to the enable terminal EN of high-voltage switch 832. In response, high-voltage switch 832 connects the HV terminal to the VE terminal, and connects the VP2 terminal to ground.

Starting at time T2, the voltage on the HV terminal is increased (ramped up), until the voltage on the HV terminal reaches a voltage greater than 10 Volts. As described above, the HV terminal is coupled to the VE terminal, such that the high-voltage ramp is applied to the VE terminal (and thereby to the control gates 50 and 51 of NVM transistors 10 and 11). Because the VP1 and VP2 terminals are both grounded, Fowler-Nordheim tunneling occurs in NVM transistors 10 and 11, thereby erasing (i.e., storing a large negative charge on) floating gates 40 and 41. After NVM transistors 10 and 11 have been erased, the voltage on the HV terminal is decreased to ground.

At time T3, the DATA signal transitions from a logic '1' state to a logic '0' state. In response, inverters 811–812 and NOR gate 821 provide a CSW5# signal that transitions to a logic '0' state. The logic '0' state of the CSW5# signal causes switch SW5 to turn on, thereby coupling the gate of p-channel transistor P1 to ground. Under these conditions, p-channel transistor P1 turns on, thereby pulling the output programming signal OP up to a logic '1' state. As a result, NOR gate 701 continues to provide a CLRSEL signal having a logic '0' state.

The logic '0' state of the DATA signal also causes NAND gate 801 to provide a logic '1' signal to the enable terminal EN of high-voltage switch 832. In response, high-voltage switch 832 connects the HV terminal to the VP2 terminal, and connects the VE terminal to ground.

Switch SW6 is also turned on, thereby applying the reference voltage $V_{REF}$ to the output terminal OUT and the VP1 terminal (via turned on transistor 854).

At this time, voltage reference circuit 700 is configured to program NVM transistor 11, wherein NVM transistor 11 and reference memory transistor 12 are connected in parallel circuit branches, with the control gates 51–52 of these transistors commonly coupled to receive the reference voltage $V_{REF}$ from reference voltage supply 60, and terminal VP2 is coupled to the HV terminal.

The voltage on the HV terminal is then increased, such that this voltage ramps up to a programming voltage greater than 10 Volts. When the voltage on the HV terminal becomes greater than the reference voltage $V_{REF}$, p-channel transistor 852 turns off and the voltage on the VP2 terminal tracks the HV signal. At time T4, the current through NVM transistor 11 becomes equal to the current through reference memory transistor 12. At this time, the voltage applied to the gate of p-channel transistor P1 transitions from a logic '0' state to a logic '1' state, thereby turning off this transistor P1. As a result, the signal OP is pulled down to a logic '0' state. In response, NOR gate 701 activates the CLRSEL signal to a logic '1' state. The logic '1' state of the CLRSEL signal causes flip-flop 835 to latch the logic '1' signal applied to its D input terminal by NAND gate 801.

Consequently, the Q output of flip-flop 835 (i.e., CSW2#) transitions to a logic '1' state, the Q# output of flip-flop 835 (i.e., CSW3#) transitions to a logic '0' state, and the CSW1# signal (provided by NAND gate 80 inverter 813) transitions to a logic '0' state. The logic '1' state of the CSW2# signal causes switches SW2 and SW4 to turn off, thereby disconnecting NVM transistor 11 from the parallel connection with reference memory transistor 12. The logic '0' states of the CSW1# and CSW3# signals turn on switches SW1 and SW3. At this time, the gate of transistor P1 is again pulled down to a logic '0' state through turned on switch SW5, reference memory transistor 12 and n-channel transistor N2. As a result, transistor P1 is turned on, the OP signal transitions to a logic '1' state, and the CLRSEL signal transitions back to a logic '0' state.

In addition, the logic '1' state of the CSW2# signal causes the output of NAND gate 802 to transition to a logic '0' state. In response, high-voltage switch 831 couples the VP2 terminal to ground, thereby stopping the programming of NVM transistor 11. High voltage switch 831 also routes the high voltage signal HV to the input terminal IN of high voltage switch 833, where this high voltage is terminated. The high voltage signal HV routed by switch 831 turns off p-channel transistor 854, thereby causing the VP1 terminal to be pulled down to ground through turned on p-channel transistor 853. At time T5, the HV signal is de-activated to a ground voltage state. At this time, the programming of NVM transistor 11 is complete.

Starting at time T6, the voltage on the HV terminal is again increased, such that this voltage ramps up to a programming voltage greater than 10 Volts. At time T7, the voltage on the HV terminal exceeds a predetermined voltage (e.g., about 5 Volts), thereby causing high-voltage detector 841 to activate a high voltage detected signal HVD, which is applied to the clock terminal of flip-flop 836. In response, flip-flop 836 latches the logic '1' value applied to its D input terminal (from the Q output of flip-flop 835). Consequently, flip-flop 836 provides a logic '1' value at its Q output terminal. Note that the high voltage detected signal HVD is activated each time the high voltage signal HV exceeds the predetermined voltage. However, when the high voltage signal HV previously exceeded the predetermined voltage, the value applied to the D input terminal of flip-flop 836 matched the value provided at the Q output terminal of flip-flop 836, such that the operation of control circuit 800 was unaffected.

The logic '1' value provided at the Q output terminal of flip-flop 836 is applied to the enable terminal EN of high-voltage switch 833, thereby creating a conductive path between the input terminal IN and output terminal O of this switch 833. As a result, the high voltage signal HV is routed through high voltage switch 833. The high voltage signal HV is further routed through turned on p-channel transistor 853 and high voltage switch 834 to programming terminal VP1. The high-voltage signal HV signal turns off p-channel transistor 854, such that the output terminal OUT remains at the reference voltage $V_{REF}$.

At this time, voltage reference circuit 700 is configured to program NVM transistor 10, wherein NVM transistor 10 and reference memory transistor 12 are connected in parallel circuit branches, with control gate 50 of NVM transistor 10 coupled to ground, control gate 52 of reference memory transistor 12 coupled to receive the reference voltage $V_{REF}$, and the VP1 terminal is coupled to receive the high voltage signal HV.

At time T8, the current through NVM transistor 10 becomes equal to the current through reference memory transistor 12. At this time, the voltage applied to the gate of p-channel transistor P1 transitions to a logic '1' value, thereby turning off p-channel transistor P1. As a result, the output program signal OP is pulled down to a logic '0' state through transistor N1. In response, NOR gate 701 activates the CLRSEL signal to a logic '1' state. The logic '1' state of the CLRSEL signal causes flip-flop 837 to latch the logic '1' signal applied to its D input terminal by the Q output of flip-flop 835. Consequently, the Q output of flip-flop 837 transitions to a logic '1' state, and the output signal provided by inverter 814 transitions to a logic '0' state. The logic '0' signal provided by inverter 814 is applied to the enable terminal EN of high-voltage switch 834, thereby causing this switch 834 to couple the VP1 terminal to ground. As a result, the programming of NVM transistor 10 is stopped.

When the VP1 terminal coupled to ground, the voltage on the gate of p-channel transistor P1 is again pulled down to a logic '0' state through turned on switch SW5. As a result, transistor P1 is turned on, the OP signal transitions to a logic '1' state, and the CLRSEL signal transitions to a logic '0' state. At time T9, the HV signal is de-activated to a ground voltage state.

At time T10, the READ# signal transitions to a logic '0' state, thereby initiating a read operation. The conditions of the read operation have been described above in connection with the time prior to T0. At this time, the voltage provided on output terminal OUT is equal to the difference between the programmed threshold voltages of NVM transistors 10 and 11, or $V_{REF}$ (i.e., $V_{REF}-0=V_{REF}$).

Although the invention has been described in connection with several embodiments, it is understood that this invention is not limited to the embodiments disclosed, but is capable of various modifications, which would be apparent to one of ordinary skill in the art. Accordingly, the present invention is only limited by the following claims.

We claim:

1. A method of providing a reference voltage in an integrated circuit, comprising:
    programming a threshold voltage of a first non-volatile memory (NVM) transistor while coupled in parallel with a reference NVM transistor;
    programming a threshold voltage of second NVM transistor while coupled in parallel with the reference NVM transistor; and
    generating a single-ended reference voltage in response to the programmed threshold voltages of the first and second NVM transistors.

2. The method of claim 1, wherein the step of programming the threshold voltage of the first NVM transistor comprises:
    applying a first reference voltage to a control gate of the first NVM transistor; and
    applying a base reference voltage to a control gate of the reference NVM transistor.

3. The method of claim 2, wherein the step of programming the threshold voltage of the first NVM transistor further comprises:
    applying a first programming voltage to a programming terminal of the first NVM transistor; and
    removing the first programming voltage from the programming terminal of the first NVM transistor when a current through the first NVM transistor at least equals a current through the reference NVM transistor.

4. The method of claim 2, wherein the step of programming the threshold voltage of the second NVM transistor comprises:
    applying a second reference voltage to a control gate of the second NVM transistor; and
    applying the base reference voltage to the control gate of the reference NVM transistor.

5. The method of claim 4, wherein the step of programming the threshold voltage of the first NVM transistor further comprises:
    applying a programming voltage to a programming terminal of the first NVM transistor; and
    removing the programming voltage from the programming terminal of the first NVM transistor when a current through the first NVM transistor at least equals a current through the reference NVM transistor;
and wherein the step of programming the threshold voltage of the second NVM transistor further comprises:
    applying a programming voltage to a programming terminal of the second NVM transistor; and
    removing the programming voltage from the programming terminal of the second NVM transistor when a current through the second NVM transistor at least equals a current through the reference NVM transistor.

6. The method of claim 2, wherein the step of generating the single-ended reference voltage comprises:
    coupling the first and second NVM transistors in parallel in a current mirror configuration;
    applying the first reference voltage to the control gate of the first NVM transistor;
    coupling the first and second NVM transistors to inputs of a differential amplifier; and
    coupling an output of the differential amplifier to the control gate of the second NVM transistor.

7. The method of claim 6, wherein the single-ended reference voltage is provided at the output of the differential amplifier.

8. The method of claim 6, wherein the single-ended reference voltage is equal to the difference between the programmed threshold voltages of the first and second NVM transistors.

9. The method of claim 1, further comprising erasing the first and second NVM transistors prior to programming the threshold voltages of the first and second NVM transistors.

10. The method of claim 9, wherein the step of erasing comprises:
    applying a first erase voltage to the control gates of the first and second NVM transistors; and
    applying a second erase voltage to programming terminals of the first and second NVM transistors.

11. The method of claim 1, wherein the threshold voltages of the first and second NVM transistors are programmed by Fowler-Nordheim tunneling.

12. The method of claim 1, further comprising initializing the threshold voltage of the reference NVM transistor to a neutral state prior to programming the threshold voltages of the first and second NVM transistors.

13. The method of claim 12, wherein the step of initializing the threshold voltage of the reference NVM transistor comprises exposing the reference NVM transistor to ultraviolet (UV) radiation.

14. The method of claim 2, further comprising selecting the first reference voltage to be ground.

15. The method of claim 2, further comprising selecting the first reference voltage to be equal to the base reference voltage.

16. The method of claim 4, wherein the single-ended reference voltage is equal to the difference between the first reference voltage and the second reference voltage.

17. A voltage reference circuit comprising:
- a first non-volatile memory (NVM) transistor having a first control gate and a first programming terminal;
- a first switch for selectively coupling the first NVM transistor between a first voltage supply terminal and a second voltage supply terminal;
- a second NVM transistor having a second control gate and a second programming terminal;
- a second switch for selectively coupling the second NVM transistor between the first voltage supply terminal and the second voltage supply terminal;
- a reference NVM transistor having a third control gate;
- a third switch for selectively coupling the reference NVM transistor between the first voltage supply terminal and the second voltage supply terminal;
- a differential amplifier having inputs coupled to the first and second NVM transistors;
- a fourth switch coupling an output of the differential amplifier to the second control gate of the second NVM transistor and the third control gate of the reference NVM transistor.

18. A voltage reference circuit comprising:
- means for programming a threshold voltage of a first non-volatile memory (NVM) transistor while coupled in parallel with a reference NVM transistor;
- means for programming a threshold voltage of second NVM transistor while coupled in parallel with the reference NVM transistor; and
- means for generating a single-ended reference voltage in response to the programmed threshold voltages of the first and second NVM transistors.

19. The voltage reference circuit of claim 18, wherein the means for programming the threshold voltage of the first NVM transistor comprises:
- means for applying a first reference voltage to a control gate of the first NVM transistor; and
- means for applying a base reference voltage to a control gate of the reference NVM transistor.

20. The voltage reference circuit of claim 19, wherein the means for programming the threshold voltage of the first NVM transistor further comprises:
- means for applying a first programming voltage to a programming terminal of the first NVM transistor; and
- means for removing the first programming voltage from the programming terminal of the first NVM transistor when a current through the first NVM transistor at least equals a current through the reference NVM transistor.

* * * * *